United States Patent
Tsai et al.

(10) Patent No.: US 12,032,891 B2
(45) Date of Patent: Jul. 9, 2024

(54) SEMICONDUCTOR SYSTEM AND OPERATION METHOD THEREOF

(71) Applicant: UNITED MICROELECTRONICS CORP., Hsin-Chu (TW)

(72) Inventors: Pin-Yen Tsai, Hsinchu (TW); Yi-Jung Chang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 331 days.

(21) Appl. No.: 17/574,527

(22) Filed: Jan. 12, 2022

(65) Prior Publication Data
US 2023/0195989 A1 Jun. 22, 2023

(30) Foreign Application Priority Data
Dec. 17, 2021 (CN) .......................... 202111549160.8

(51) Int. Cl.
*G06F 30/392* (2020.01)
*G06N 20/10* (2019.01)

(52) U.S. Cl.
CPC ........... *G06F 30/392* (2020.01); *G06N 20/10* (2019.01)

(58) Field of Classification Search
CPC ..... G06F 30/392; G06F 30/398; G06N 20/10; G06N 20/00
See application file for complete search history.

(56) References Cited

U.S. PATENT DOCUMENTS

| 8,863,044 B1* | 10/2014 | Casati | G06F 30/392 |
| | | | 716/112 |
| 2013/0031518 A1* | 1/2013 | Robles | G06F 30/398 |
| | | | 716/52 |
| 2016/0378902 A1* | 12/2016 | Graur | G06F 30/394 |
| | | | 716/52 |
| 2018/0300434 A1* | 10/2018 | Hu | G03F 7/70508 |
| 2020/0372365 A1 | 11/2020 | Cecil | |
| 2021/0081509 A1* | 3/2021 | Salik | G06T 7/0004 |
| 2021/0240906 A1* | 8/2021 | Salik | G06T 7/001 |

FOREIGN PATENT DOCUMENTS

WO WO-2022012888 A1 * 1/2022 ......... G06F 18/2185

OTHER PUBLICATIONS

Tsai, the specification, including the claims, and drawings in the U.S. Appl. No. 16/275,480, filed Feb. 14, 2019.

* cited by examiner

*Primary Examiner* — Stacy Whitmore
(74) *Attorney, Agent, or Firm* — Winston Hsu

(57) ABSTRACT

The invention provides an operation method of a semiconductor system, which includes providing a system which includes a layout pattern to scanning electron microscope (SEM) pattern prediction model (LS model) and a novelty detection model (ND model), inputting a layout pattern to the ND model, and the ND model judges whether the layout pattern is a novel layout pattern, and if the layout pattern is confirmed as the novel layout pattern after judgment, performing a process step on the novel layout pattern to form an SEM (scanning electron microscope) pattern.

10 Claims, 2 Drawing Sheets

SEMICONDUCTOR SYSTEM AND OPERATION METHOD THEREOF

BACKGROUND OF THE INVENTION

1. Field of the Invention

The present invention relates to the field of semiconductor manufacturing processes, in particular to a semiconductor system and its operation method. The system is used for predicting the conversion of layout patterns into SEM patterns and determining whether the input layout patterns are novel patterns that the system has not yet learned.

2. Description of the Prior Art

In the semiconductor manufacturing process, it is one of the most commonly used technologies to use a mask to generate the desired pattern on the material layer. The pattern designed on the mask is usually called layout pattern, which also means the ideal pattern designed by the operator. However, in fact, the pattern generated on the material layer is usually different from the layout pattern, for example, the edges may be rounded or the thinner parts are easy to break, and so on. At this time, it is necessary to adjust the layout pattern to successfully generate the required pattern on the material layer.

In order to facilitate the operator to evaluate the situation after the layout pattern is generated on the material layer, some manufacturers have developed a prediction system, which can automatically predict the pattern generated on the material layer according to the prediction model established in the system. However, the above system can still be improved. For example, when the input layout pattern is a novel pattern that has not been learned by the prediction model, the system cannot determine that the pattern is novel, but directly predicts and generates the wrong pattern. This will reduce the accuracy of system prediction.

SUMMARY OF THE INVENTION

The invention provides an operation method of a semiconductor system, which includes providing a system which includes a layout pattern to a scanning electron microscope pattern prediction model (LS model) and a novelty detection model (ND model), inputting a layout pattern to the novelty detection model, and the novelty detection model determines whether the layout pattern is a novel layout pattern, and if the layout pattern is determined as a novel layout pattern after judgment, performing a process step by using the novel layout pattern to form a SEM (scanning electron microscope) pattern, wherein the SEM pattern corresponds to the novel layout pattern.

The invention also provides a semiconductor system, which comprises a layout pattern to a scanning electron microscope pattern prediction model (LS model) and a novelty detection model (ND model), after a layout pattern is input to the ND model, the ND model judges whether the layout pattern is a novel layout pattern, and if the layout pattern is confirmed as a novel layout pattern after judgment, the system forms an SEM (scanning electron microscope) pattern, the SEM pattern corresponds to the novel layout pattern, and the system obtains the latent codes (key features) of the layout pattern with this paired information and retrains the LS model.

The invention is characterized by providing a system for predicting layout patterns to simulate the real scanning electron microscope (SEM) patterns generated on the material layer. The invention improves the LS model by adding a novelty detection model. When a new set of layout patterns are input into the system, the novelty detection model judges whether there are layout patterns that have not been learned by the model from macroscopic and microscopic aspects, and then the novelty detection model can find out these novel layout patterns. Then, the operator can actually process these patterns to collect the real SEM patterns, and feedback the collected real SEM patterns to the system to improve the prediction accuracy of the system. According to the system provided by the invention, the real SEM patterns are only collected for the layout patterns that have not been learned, so that a great deal of working time can be saved and the prediction accuracy can be improved.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
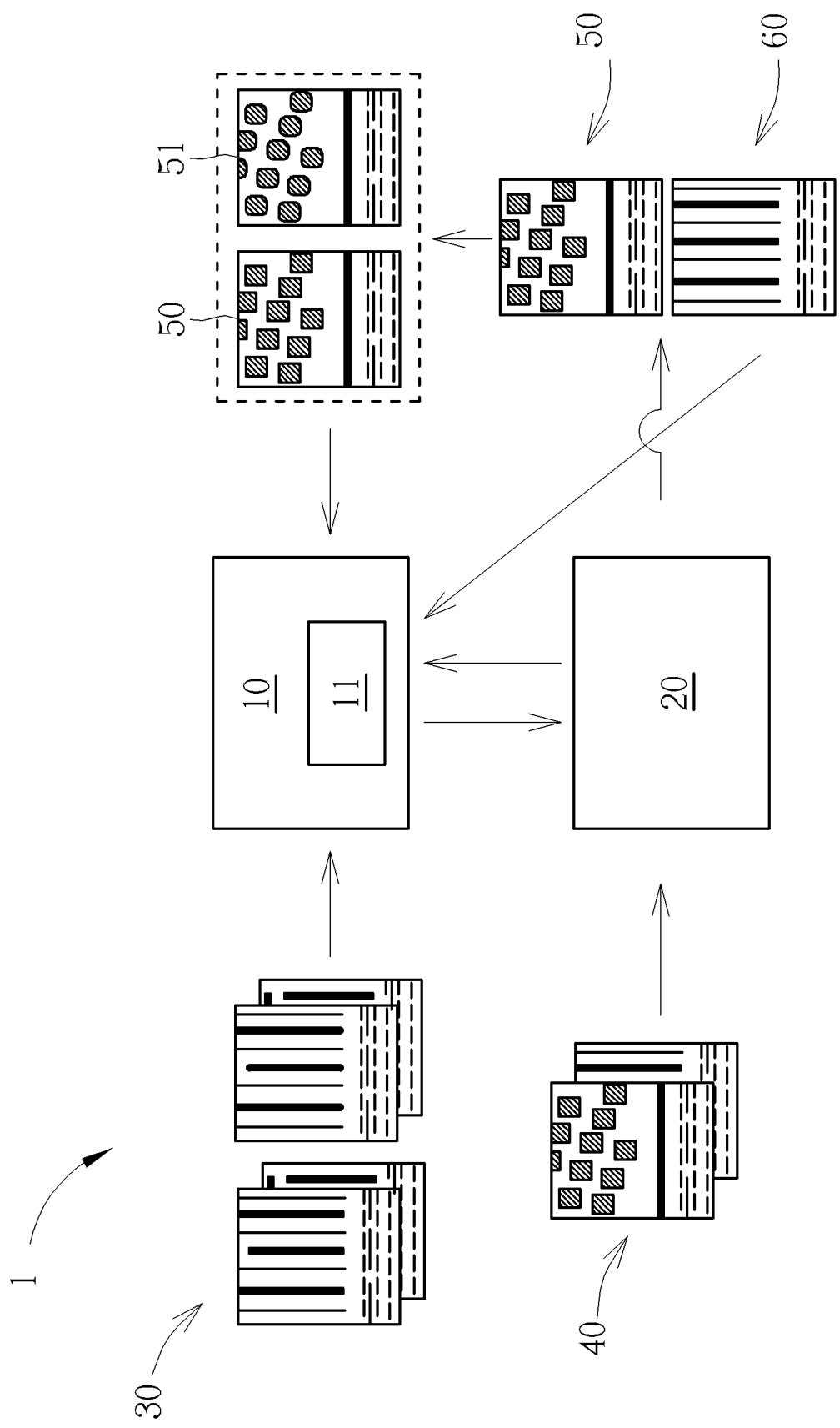
FIG. 1 shows a block diagram of the system provided by the present invention.

FIG. 1 shows a block diagram of the system provided by the present invention. As shown in FIG. 1, the system 1 of the present invention mainly includes two models, namely, a layout pattern to scanning electron microscope pattern prediction model (also referred to as Layout to SEM model, or LS model) 10 and a novelty detection model (referred to as ND model) 20. Both of them are located in the same system, for example, they can exist in a computer system.

The function of the LS model 10 described here is to input multiple sets of past data, including multiple sets of layout patterns and corresponding scanning electron microscope (SEM) patterns into the LS model 10 to establish the learning database of the LS model for training the machine learning model. For example, multiple sets of pattern pairs 30 in FIG. 1 will be input into the LS model 10, where the pattern pairs 30 include multiple sets of layout patterns and corresponding real SEM patterns. The above-mentioned layout pattern is, for example, the pattern on the mask, while the real SEM pattern is obtained by forming the layout pattern on the substrate or material layer after the patterning process by using the mask, and observing it with a scanning electron microscope (SEM). When the machine learning model 11 of the LS model 10 establishes enough data, a layout pattern is input, and the LS model 10 can directly generate a predicted SEM pattern according to the content of the machine learning model 11.

At present, the LS model 10 still needs to be improved. For example, if the input layout pattern has exceeded the range of the machine learning model 11, the LS model 10 will not notice that the set of patterns are novel patterns, but will directly predict the SEM patterns. At this time, there is often a huge error between the predicted SEM pattern and the real SEM pattern. That is to say, the existing LS model 10 has a problem that the layout patterns of key features (latent codes) that have not been learned by the machine learning model 11 cannot be detected or found out, so that wrong SEM patterns will be generated, resulting in inaccurate prediction of the LS model 10.

On the other hand, if the operator carries out the patterning process on each set of layout patterns newly input into the LS model 10 to generate real SEM patterns in order to avoid the prediction error of the LS model 10, the purpose of prediction with the LS model 10 will be lost (because the LS model was originally used to predict the possible SEM patterns generated by the layout patterns in order to save time, if the real SEM patterns have been generated, there is no meaning to use the LS model 10), and the actual patterning process to generate the real SEM pattern will also consume chips and manpower, which will result in loss of materials and time costs.

The "real SEM pattern" mentioned in the present invention refers to the layout pattern formed on the substrate or material layer according to the process, and then the obtained pattern is observed by SEM. The "predicted SEM pattern" mentioned in the present invention is a simulated SEM pattern generated by the LS model after the layout pattern is input, which will be explained here first.

Therefore, in order to improve the above situation, the system 1 of the present invention includes not only the LS model 10, but also a novelty detection model 20 (hereinafter referred to as ND model for short). The function of the ND model 20 is that when multiple sets of layout patterns are input into the system 1, the ND model 20 will first find out some or all layout patterns of the multiple sets of layout patterns that have not been learned by the machine learning model 11 (these layout patterns are defined as novel layout patterns here), and then the user can obtain the real SEM patterns only for these found novel layout patterns through the process, thus achieving the purpose of saving the process steps.

More specifically, please refer to FIG. 1, when multiple sets of layout patterns 40 are input into the system 1, they will first pass through the ND model 20. It should be noted that the layout patterns 40 described here are all expected to be input to the LS model 10 and converted into predicted SEM patterns in the following steps, so naturally, these layout patterns 40 have not been actually processed to generate corresponding real SEM patterns. Here, some or all of the key features of the layout patterns in the multiple sets of layout patterns 40 may not be learned by the machine learning model 11 (that is, if these layout patterns are directly input into the LS model 10, there is a great possibility that wrong SEM patterns will be generated).

Please continue to refer to FIG. 1. After these layout patterns 40 are judged by the ND model 20, some layout patterns 40 may be judged as novel layout patterns 50 by the ND model 20, while the remaining layout patterns 40 may be judged as old layout patterns 60 by the ND model 20. More specifically, the novel layout pattern 50 described here is the layout pattern of the key features that have not been learned by the machine learning model 11. If these layout patterns are directly input to the LS model 10 for SEM pattern prediction, wrong SEM patterns may be generated. On the other hand, the old layout pattern 60 is a layout pattern which is judged by the ND model 20 to have been learned by the machine learning model 11. For example, it is possible that similar or identical layout patterns and key features of their corresponding real SEM patterns already exist in the machine learning model 11, so in the next step, the old layout pattern 60 can be directly input into the LS model 10 to generate accurate predicted SEM patterns.

Next, the user performs the semiconductor process according to these novel layout patterns 50 found by the ND model 20 to generate real patterns on the substrate or material layer, and collects the corresponding real SEM patterns 51. In other words, the real SEM pattern 51 described here corresponds to the novel layout pattern 50. Then, the novel layout pattern 50 and the corresponding real SEM pattern 51 are re-input into the LS model 10 to establish new key feature data in the machine learning model 11 and strengthen the content of the machine learning model 11.

Figure 2:
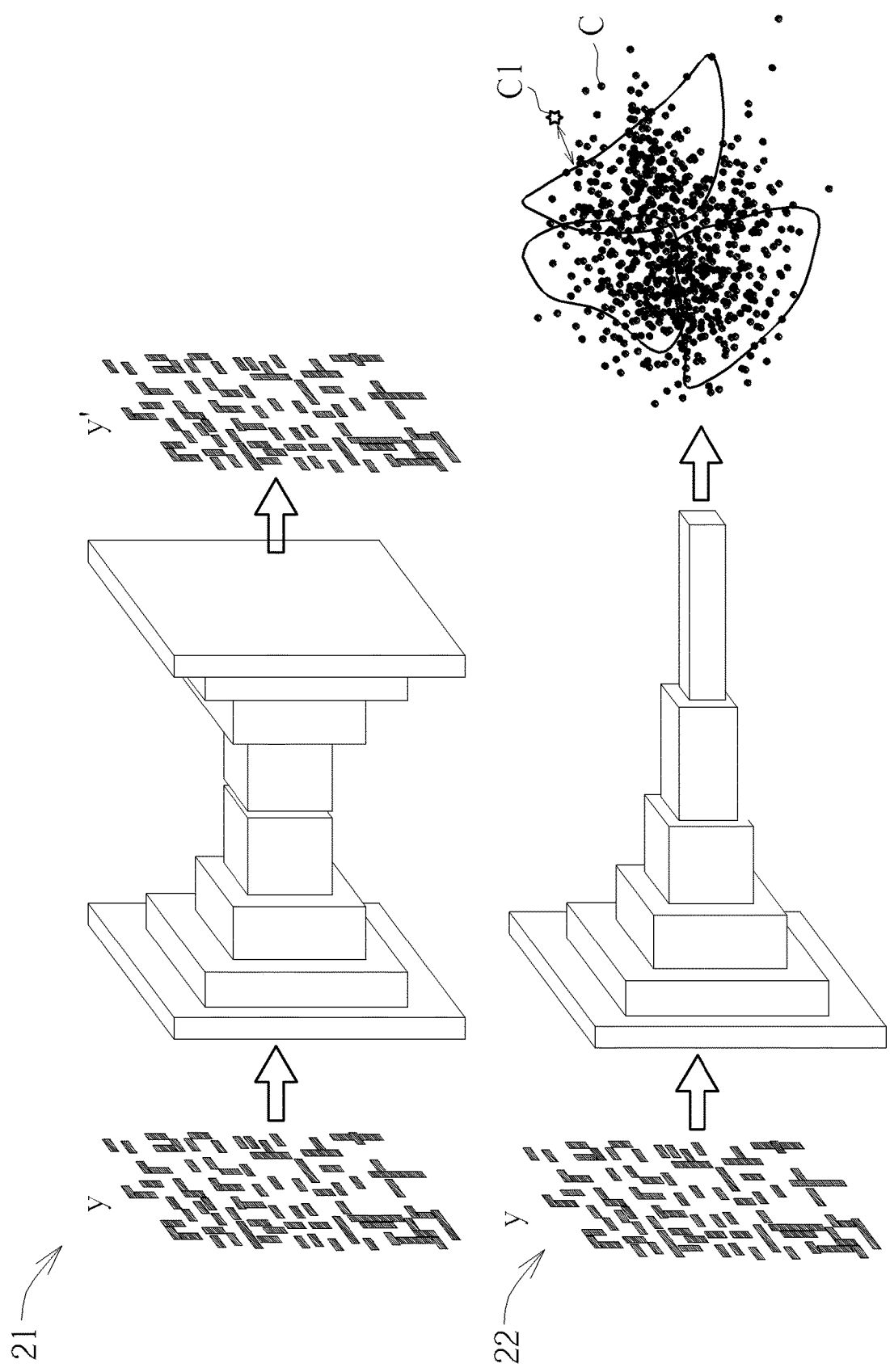
FIG. 2 is a schematic diagram showing the operation principle of the novelty detection model of the present invention.

The above paragraphs have explained the operation method and flow of the system of the present invention, and then introduced how the ND model 20 of the present invention determines whether a set of layout patterns are novel layout patterns. Please refer to FIG. 2, which is a schematic diagram of the operation principle of the novelty detection model of the present invention. The ND model 20 includes two models, namely an auto encoder comparison model 21 and a support vector machine (SVM) comparison model 22. The upper part of FIG. 2 depicts the auto encoder comparison model 21, and the lower part of FIG. 2 depicts the support vector machine (SVM) comparison model 22. First, the auto encoder comparison model 21 is introduced. The layout pattern to be input is defined as Y. After the layout pattern y is input into the auto encoder comparison model 21, the information of the layout pattern will be gradually compressed, and finally a latent code will be generated. Then, the compressed layout pattern y will be decompressed to regenerate a reconstructed layout pattern y', and then the layout pattern y will be compared with the reconstructed layout pattern y' to determine whether the difference between them is allowable. It is worth noting that the latent code mentioned here can also be understood as the key feature combination of layout pattern y. If the same key features have been learned in the machine learning model 11, the layout pattern can be well reconstructed through the key feature combination, so when the layout pattern y and layout pattern y' are compared, the difference between them will be very small. On the contrary, if the key features of the layout pattern are not learned by the machine learning model 11, the auto encoder comparison model 21 cannot effectively decompress the key features to generate the correct latent code, which makes it difficult to reconstruct the layout pattern, resulting in a great difference between the layout pattern y and the layout pattern y' when they are compared.

The above process of compressing layout pattern y is equivalent to filtering some minor information, leaving only a part of key information. The working principle of the auto encoder comparison model 21 is to compare the layout pattern y with the layout pattern y' regenerated after compression and decompression to determine whether the layout pattern is a novel layout pattern. That is to say, if the layout pattern y is far from the layout pattern y', it means that the auto encoder comparison model 21 cannot recognize the original layout pattern y because it may contain novel key features, so the process of regenerating the layout pattern y' by the auto encoder comparison model 21 fails, and the layout pattern y may be judged as a novel layout pattern at this time. In addition, the auto encoder comparison model 21 is used to compare the differences of the overall layout patterns, so its function is to compare the overall patterns, that is, to compare the patterns from the macroscopic aspect.

As for the support vector machine (SVM) comparison model 22, it compares patterns from the microscopic aspect. Its working principle is partially the same as that of the above-mentioned auto encoder comparison model 21. After information compression of the layout pattern y to be input, the latent code of the layout pattern y is obtained, and then the latent code is classified by SVM (as shown in the lower half of FIG. 2). At the same time, there are already many data points of the old layout patterns on the classification map (representing the latent code C of the existing layout patterns in the machine learning model). As shown in the lower half of FIG. 2, the latent code of layout pattern y is defined as C1 in SVM classification map, and the latent code C1 is compared with other existing latent code C in the map. If the latent code C1 can be classified into the same group as part of the latent code C, or the two are close enough, and the latent code C1 representing the layout pattern y is similar to or classified into the same group as the latent code C of the existing part of the layout pattern, in this case, there is a high probability that the pattern information contained in the layout pattern y has been learned by the machine learning model 11. On the other hand, if the latent code C1 of the layout pattern y is not similar to any latent code C of existing layout patterns or cannot be classified into the same group, then there is a high probability that the pattern information contained in the layout pattern y has not been learned by the machine learning model 11, that is, the layout pattern y can be identified as a novel layout pattern 50.

The SVM method mentioned above belongs to a known analysis and learning algorithm. In short, in machine learning, support vector machine (also known as support vector network) is a supervised learning model and related learning algorithm for analyzing data in classification and regression analysis. Given a set of training examples, each training example is marked as belonging to one or the other of two categories, and SVM training algorithm establishes a model that assigns a new example to one of two categories, making it a non-probabilistic binary linear classifier. The SVM model represents instances as points in space, so that the corresponding instances of individual categories are spaced apart. Then, the new instances are mapped to the same space, and the category is predicted based on which side of the interval they fall. As for other details about SVM method, it belongs to the known technology in this field, so it will not be repeatedly described here.

Therefore, based on the above description and drawings, the operation method of a semiconductor system of the present invention includes providing a system 1, which includes a layout pattern to a scanning electron microscope pattern prediction model (LS model) 10 and a novelty detection model (ND model) 20, inputting a layout pattern 40 to the novelty detection model 20, and the novelty detection model 20 determines whether the layout pattern 40 is a novel layout pattern 50. If the layout pattern 40 is determined to be a novel layout pattern 50, a process step is performed by using the novel layout pattern 50 to form a SEM (scanning electron microscope) pattern 51, wherein the SEM pattern 51 corresponds to the novel layout pattern 50.

In some embodiments of the present invention, the novelty detection model 20 includes an auto encoder comparison model 21 and a support vector machine (SVM) comparison model 22.

In some embodiments of the present invention, after the layout pattern 40 is input into the novelty detection model 20, the novelty detection model 20 performs an information compression step on the layout pattern 40 and extracts a latent code from the layout pattern.

In some embodiments of the present invention, the auto encoder comparison model 21 performs a decompression step on the latent code to generate a reconstructed pattern y', and compares the reconstructed pattern y' with the layout pattern y.

In some embodiments of the invention, the support vector machine (SVM) comparison model 22 performs a support vector machine (SVM) comparison step on the latent code.

In some embodiments of the present invention, it further includes providing multiple sets of layout patterns and multiple sets of corresponding SEM patterns combined into pattern pairs 30, and inputting the pattern pairs 30 to the LS model 10 to establish a machine learning model 11.

In some embodiments of the present invention, after the process steps of the novel layout pattern 50 are performed, the generated SEM pattern 51 is also input into the machine learning model 11 of the LS model 10.

In some embodiments of the present invention, if the layout pattern is determined to be not a novel layout pattern after judgment, the SEM pattern will not be collected.

The invention also provides a semiconductor system, which comprises a layout pattern to LS model 10 and a novelty detection model 20, after inputting a layout pattern 40 to the novelty detection model 20, the novelty detection model 20 judges whether the layout pattern 40 is a novel layout pattern, if the layout pattern 40 is confirmed as the novel layout pattern 50 after judgment, the system forms a SEM (scanning electron microscope) pattern 51, extracts a latent code of the novel layout pattern 50 through a machine learning model 11 and stores the latent code in the LS model 10, wherein the SEM pattern 51 corresponds to the novel layout pattern 50.

In some embodiments of the present invention, the novelty detection model 20 includes an auto encoder comparison model 21 and a support vector machine (SVM) comparison model 22.

In some embodiments of the present invention, the layout pattern to LS model 10 includes a machine learning model 11, and the machine learning model 11 stores a plurality of latent codes of the layout patterns and the corresponding SEM patterns (the pattern pairs 30).

The invention is characterized by providing a system for predicting layout patterns to simulate the real scanning electron microscope (SEM) patterns generated on the material layer. The invention improves the LS model by adding a novelty detection model. When a new set of layout patterns are input into the system, the novelty detection model judges whether there are layout patterns that have not been learned by the model from macroscopic and microscopic aspects, and then the novelty detection model can find out these novel layout patterns. Then, the operator can actually process these patterns to collect the real SEM patterns, and feedback the collected real SEM patterns to the system to improve the prediction accuracy of the system. According to the system provided by the invention, the real SEM patterns are only collected for the layout patterns that have not been learned, so that a great deal of working time can be saved and the prediction accuracy can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of operating a semiconductor system, comprising:
provide a system, which includes a layout pattern to scanning electron microscope pattern prediction model (LS model) and a novelty detection model (ND model);
inputting a layout pattern to the novelty detection model, and the novelty detection model judges whether the layout pattern is a novel layout pattern;
if the layout pattern is confirmed as the novel layout pattern after judgment, a process step is performed by using the novel layout pattern to form a SEM (scanning electron microscope) pattern, wherein the SEM pattern corresponds to the novel layout pattern; and
providing multiple sets of layout patterns and multiple sets of corresponding SEM patterns, and inputting the layout patterns to the LS model to establish a machine learning model of the LS model.

2. The operation method of the semiconductor system according to claim 1, wherein the novelty detection model comprises an auto encoder comparison model and a support vector machine (SVM) comparison model.

3. The operation method of the semiconductor system according to claim 2, wherein after the layout pattern is input into the novelty detection model, the novelty detection model performs an information compression step on the layout pattern and extracts a latent code from the layout pattern.

4. The operation method of the semiconductor system according to claim 3, wherein the auto encoder comparison model performs a decompression step on the latent code to generate a reconstructed pattern, and compares the reconstructed pattern with the layout pattern.

5. The operation method of the semiconductor system according to claim 3, wherein the support vector machine (SVM) comparison model performs a support vector machine (SVM) comparison step on the latent code.

6. The operation method of the semiconductor system according to claim 1, wherein the process step is carried out by using the novel layout pattern, the generated SEM pattern is also input into a database of the LS model for training the machine learning model.

7. The operation method of the semiconductor system according to claim 1, wherein if the layout pattern is confirmed not to be the novel layout pattern after judgment, the SEM pattern of the layout pattern will not be collected.

8. A semiconductor system comprising:
a layout pattern to scanning electron microscope pattern prediction model (LS model) and a novelty detection model (ND model);
wherein, after inputting a layout pattern to the novelty detection model, the novelty detection model judges whether the layout pattern is a novel layout pattern, if the layout pattern is confirmed as the novel layout pattern after judgment, the system forms a SEM (scanning electron microscope) pattern, extracts a latent code of the novel layout pattern through a machine learning model and stores the latent code in the LS model, wherein the SEM pattern corresponds to the novel layout pattern.

9. The semiconductor system according to claim 8, wherein the novelty detection model comprises an auto encoder comparison model and a support vector machine (SVM) comparison model.

10. The semiconductor system according to claim 8, wherein the LS model comprises a machine learning model, and the machine learning model stores a plurality of latent codes of the layout patterns and the corresponding SEM patterns.

* * * * *